US012000060B2

(12) United States Patent
Shen et al.

(10) Patent No.: US 12,000,060 B2
(45) Date of Patent: Jun. 4, 2024

(54) SEMICONDUCTOR CRYSTAL GROWTH METHOD AND DEVICE

(71) Applicant: ZING SEMICONDUCTOR CORPORATION, Shanghai (CN)

(72) Inventors: Weimin Shen, Shanghai (CN); Gang Wang, Shanghai (CN); Hanyi Huang, Shanghai (CN); Yun Liu, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 274 days.

(21) Appl. No.: 17/606,694

(22) PCT Filed: Jan. 16, 2020

(86) PCT No.: PCT/CN2020/072501
§ 371 (c)(1),
(2) Date: Oct. 26, 2021

(87) PCT Pub. No.: WO2020/220766
PCT Pub. Date: Nov. 5, 2020

(65) Prior Publication Data
US 2022/0213614 A1    Jul. 7, 2022

(30) Foreign Application Priority Data

Apr. 29, 2019   (CN) .......................... 201910357352.5

(51) Int. Cl.
*C30B 15/14*   (2006.01)
*C30B 15/10*   (2006.01)
(Continued)

(52) U.S. Cl.
CPC .............. *C30B 15/14* (2013.01); *C30B 15/10* (2013.01); *C30B 15/20* (2013.01); *C30B 29/06* (2013.01)

(58) Field of Classification Search
CPC ......... C30B 15/10; C30B 15/20; C30B 15/14; C30B 29/06
See application file for complete search history.

(56) References Cited

U.S. PATENT DOCUMENTS

| 4,591,409 A | * | 5/1986 | Ziem ....................... C30B 29/06 |
| | | | 148/DIG. 41 |
| 5,268,063 A | * | 12/1993 | Kaneko ................... C30B 15/14 |
| | | | 117/34 |

(Continued)

FOREIGN PATENT DOCUMENTS

| CN | 101148777 A | 3/2008 |
| CN | 101724891 A | 6/2010 |

(Continued)

OTHER PUBLICATIONS

International Patent Application No. PCT/CN2020/072501; Int'l Search Report; dated Mar. 19, 2020; 2 pages.

*Primary Examiner* — Robert M Kunemund
(74) *Attorney, Agent, or Firm* — BakerHostetler

(57) ABSTRACT

A semiconductor crystal growth method and device are provided. The method comprises: obtaining an initial position of a graphite crucible when used in a semiconductor crystal growth process for the first time; obtaining a current production batch of the graphite crucible which characterizes a number of times of growth processes performed by the graphite crucible so far; and loading polysilicon raw materials into a quartz crucible sleeved in the graphite crucible based on the current production batch, wherein a total weight of the materials is called a charging amount, and the charging amount is adjusted based on the current production batch to keep an initial position of a silicon melt liquid surface in the quartz crucible stable while keeping the initial position of the graphite crucible unchanged. The present invention ensures the stability of each parameter in the (Continued)

crystal pulling process, and enhances the crystal pulling speed and quality.

7 Claims, 3 Drawing Sheets

(51) Int. Cl.
  *C30B 15/20* (2006.01)
  *C30B 29/06* (2006.01)

(56) References Cited

U.S. PATENT DOCUMENTS

| | | | |
|---|---|---|---|
| 5,471,943 A * | 12/1995 | Scheel | C30B 15/30 |
| | | | 117/31 |
| 5,980,629 A * | 11/1999 | Hansen | C30B 15/10 |
| | | | 65/33.1 |
| 8,885,915 B2 | 11/2014 | Sugawara et al. | |
| 10,233,565 B2 | 3/2019 | Yamada et al. | |
| 2005/0022722 A1 | 2/2005 | Takanashi et al. | |
| 2013/0058540 A1 | 3/2013 | Sugawara et al. | |
| 2016/0186359 A1 * | 6/2016 | Takanashi | G06T 7/62 |
| | | | 117/14 |
| 2017/0292204 A1 * | 10/2017 | Sato | C30B 15/20 |
| 2018/0266011 A1 | 9/2018 | Yamada et al. | |

FOREIGN PATENT DOCUMENTS

| | | |
|---|---|---|
| CN | 101724891 B | 10/2012 |
| CN | 106048723 A | 10/2016 |
| CN | 106687624 A | 5/2017 |
| CN | 106906513 A | 6/2017 |
| CN | 108138355 A | 6/2018 |
| CN | 106906513 B | 3/2019 |
| CN | 106687624 B | 5/2019 |
| CN | 108138355 B | 7/2020 |
| DE | 112011101587 T5 | 3/2013 |
| DE | 112011101587 B4 | 5/2018 |
| DE | 112016004171 T5 | 5/2018 |
| EP | 3199668 A1 | 8/2017 |
| EP | 3199668 B1 | 7/2019 |
| JP | 2010-105914 A | 5/2010 |
| JP | 2012-001387 A | 1/2012 |
| JP | 5577873 B2 | 8/2014 |
| JP | 6067146 B2 | 1/2017 |
| JP | 2017-052699 A | 3/2017 |
| JP | 2017-075066 A | 4/2017 |
| JP | 6373950 B2 | 8/2018 |
| JP | 6536345 B2 | 7/2019 |
| KR | 2013-0132697 A | 12/2013 |
| KR | 10-1729472 B1 | 4/2017 |
| KR | 2017-0057413 A | 5/2017 |
| KR | 2018-0063124 A | 6/2018 |
| KR | 10-1911946 B1 | 10/2018 |
| TW | 201617487 A | 5/2016 |
| TW | I592524 B | 7/2017 |
| TW | 201732095 A | 9/2017 |
| WO | WO 2011/158425 A1 | 12/2011 |
| WO | WO 2016/047693 A1 | 3/2016 |
| WO | WO 2017/064834 A1 | 4/2017 |

* cited by examiner

---

SEMICONDUCTOR CRYSTAL GROWTH METHOD AND DEVICE

CROSS-REFERENCE TO RELATED APPLICATIONS

This application is the National Stage of International Patent Application No. PCT/CN2020/072501, filed on Jan. 16, 2020, which claims the priority to Chinese Patent Application No. 201910357352.5, filed on Apr. 29, 2019, the disclosures of which are incorporated herein by reference in their entireties.

BACKGROUND

The present invention relates to the field of semiconductor manufacturing, in particular to a semiconductor crystal growth method and device.

The Czochralski method (Cz) is an important method of preparing single-crystal silicon for use in semiconductors and photovoltaic (PV) industry. The high-purity silicon material placed in the crucible is heated by a hot zone composed of carbon materials and is melted, and then a single-crystal ingot is finally obtained by immersing seed crystal in the melt and subjecting to a series of (Neck, Shoulder, Body, Tail, Cooling) processes.

In the crystal growth of semiconductor single-crystal silicon or PV single-crystal silicon using the Cz method, the distributions of temperatures of the crystal and the melt directly affect the quality and growth rate of the crystal. Therefore, the heating power control of the heater that provides the heat source for crystal growth is the most critical part of the crystal growth process. Generally, the control method is to set different heater current power P according to different crystal equal diameter length LEN.

In the semiconductor crystal growth process, a quartz crucible is sleeved in the graphite crucible, and the silicon melt contained in the quartz crucible is melted by the graphite crucible absorbing the radiant heat of the heater to form a silicon melt. As the length of the crystal increases, the volume of the melt in the quartz crucible decreases, the position of the quartz crucible and the graphite crucible incorporating the quartz crucible needs to be raised (hereinafter referred to as the crucible position CP) as the crystal length increase to ensure that the distance (hereinafter referred to as the liquid surface distance GAP) between the melt liquid surface and the flow tube does not change, and that the relative position of the melt liquid surface and the vertical direction of the heater does not change. For example, the patent application document with the application No. JP2010136937 discloses a method of controlling the manufacture of single-crystal silicon, which accurately measures the distance between the melt surface and the lower end surface of the heat insulating member located at the lower part of the flow tube and controls the distance based on the measurements, thereby precisely controlling the distance between the melt surface and the heat insulating member to control the axial temperature of crystal growth.

For semiconductor single-silicon wafers, however, there are very strict and stable quality requirements, and stable processes including stable process parameters are required during the growth of silicon crystals. Therefore, the same polysilicon charging weight W0, the same liquid surface distance GAP, and the same process settings, such as crystal pulling speed PS at different stages, crystal rotation speed SR, crucible rotation speed CR, target temperature T or power P of the heater at different stages, will be adopted.

Meanwhile, in actual batch production, there are still situations in which process parameters (such as target temperature T or target heating power P) need to be adjusted and modified due to the consumption of components such as the graphite crucible as the process progresses, since the adjustment and modification of the process parameters often lead to change in crystal quality (such as crystal diameter, oxygen content and internal defects, etc.).

To this end, it is necessary to propose a new semiconductor crystal growth method and device to solve the problems in the prior art.

SUMMARY

A series of simplified forms of concepts is introduced into the portion of Summary, which would be further illustrated in the portion of the detailed description. The Summary of the present invention does not mean attempting to define the key features and essential technical features of the claimed technical solution, let alone attempting to determine the protection scope thereof.

In order to solve the problems in the prior art, the present invention provides a semiconductor crystal growth method, the method comprises:

obtaining an initial position CP0 of a graphite crucible when used in a semiconductor crystal growth process for the first time; and
  obtaining a current production batch N of the graphite crucible, the current production batch N characterizing a number of times of semiconductor crystal growth processes performed by the graphite crucible so far; and
  loading polysilicon raw materials into a quartz crucible sleeved in the graphite crucible based on the current production batch N, wherein a total weight of the polysilicon raw materials is called a charging amount W (N), and the charging amount W (N) is adjusted based on the current production batch N so as to keep an initial position of liquid surface of a silicon melt in the quartz crucible stable while keeping the initial position CP0 of the graphite crucible unchanged.

Exemplarily, the method further comprises obtaining a charging amount W(1) in the quartz crucible when the graphite crucible is used in the semiconductor growth process for the first time and a charging amount dW that should be increased in the quartz crucible when the graphite crucible is used in the current production batch N, wherein the charging amount W(N) is a sum of the charging amount W(1) in the quartz crucible when the graphite crucible is used in the semiconductor growth process for the first time and the charging amount dW that should be increased in the quartz crucible when the graphite crucible is used in the current production batch N.

Exemplarily, the method for obtaining the charging amount dW in the crucible that should be increased in the current production batch N comprises:

Obtaining a calculated initial position CP0(N)' of the graphite crucible in the current production batch N to ensure that the initial position of liquid surface of the silicon melt remains unchanged in the case that the charging amount in the quartz crucible remains unchanged;

obtaining an initial position difference dCP0(N) based on the calculated initial position CP0(N)' and the initial position CP0 of the graphite crucible when used in the semiconductor growth process for the first time, wherein dCP0(N)=CP0(N)'−CP0; and obtaining a charging amount dW that should be increased in the quartz crucible in the current production batch N based on the initial position difference dCP0(N).

Exemplarily, the calculated initial position CP0(N)' is obtained by the following equation:

CP0(N)'=A*N+B, where A is a batch impact factor of the crucible and B is a wall thickness related parameter of the crucible.

Exemplarily, the batch impact factor A and the wall thickness related parameter B are obtained by the steps of:

obtaining a large number of batches M of semiconductor crystal growth processes performed using a same graphite crucible, wherein the quartz crucible sleeved in the graphite crucible has the same charging amount in the large number of batches M of semiconductor crystal growth processes, and same initial position of liquid surface of the silicon melt is obtained by adjusting the initial position of the graphite crucible;

obtaining an adjusted initial position CP0(i) of the graphite crucible in each batch of the large number of batches M of semiconductor crystal growth processes, where i=1, 2 . . . M;

obtaining a correlation between the adjusted initial position CP0 (i) of the crucible and a batch i based on the adjusted initial position CP0 (i) of the graphite crucible; and obtaining the batch impact factor A and the wall thickness related parameter B based on the correlation.

Exemplarily, the step of obtaining the correlation between the adjusted initial position CP0 (i) of the graphite crucible and the batch i based on the adjusted initial position CP0 (i) of the graphite crucible comprises obtaining a correlation curve between the adjusted initial position CP0(i) of the graphite crucible and the batch i.

Exemplarily, the charging amount dW that should be increased in the quartz crucible in the current production batch N is obtained by the following equation:

$$dW = \pi\left(\frac{D}{2}\right)^2 * dCP0(N) * Rho,$$

where D is a diameter of the quartz crucible, and Rho is a density of the silicon melt.

The present invention further provides a semiconductor crystal growth device, comprising a memory storing executable program instructions and a controller, wherein the controller causes the semiconductor growth device to execute the method of any one of claims 1 to 9 when performing the executable program instructions.

According to the semiconductor crystal growth method and device of the present invention, in the crystal pulling process, the initial position of the graphite crucible is configured to be unchanged and the charging amount in the quartz crucible is changed to ensure the stability of the initial position of liquid surface of the silicon melt in the quartz crucible, which effectively reduces the adjustment of process parameters in the crystal pulling process, ensures the stability of various parameters in the crystal pulling process, and improves the crystal pulling speed and quality.

BRIEF DESCRIPTION OF THE DRAWINGS

The following drawings are hereby incorporated as part of the present invention for the understanding of the present invention. The drawings illustrate embodiments of the present invention and description thereof for explaining the principle of the present invention.

In the drawings.

DETAILED DESCRIPTION

Figure 1:
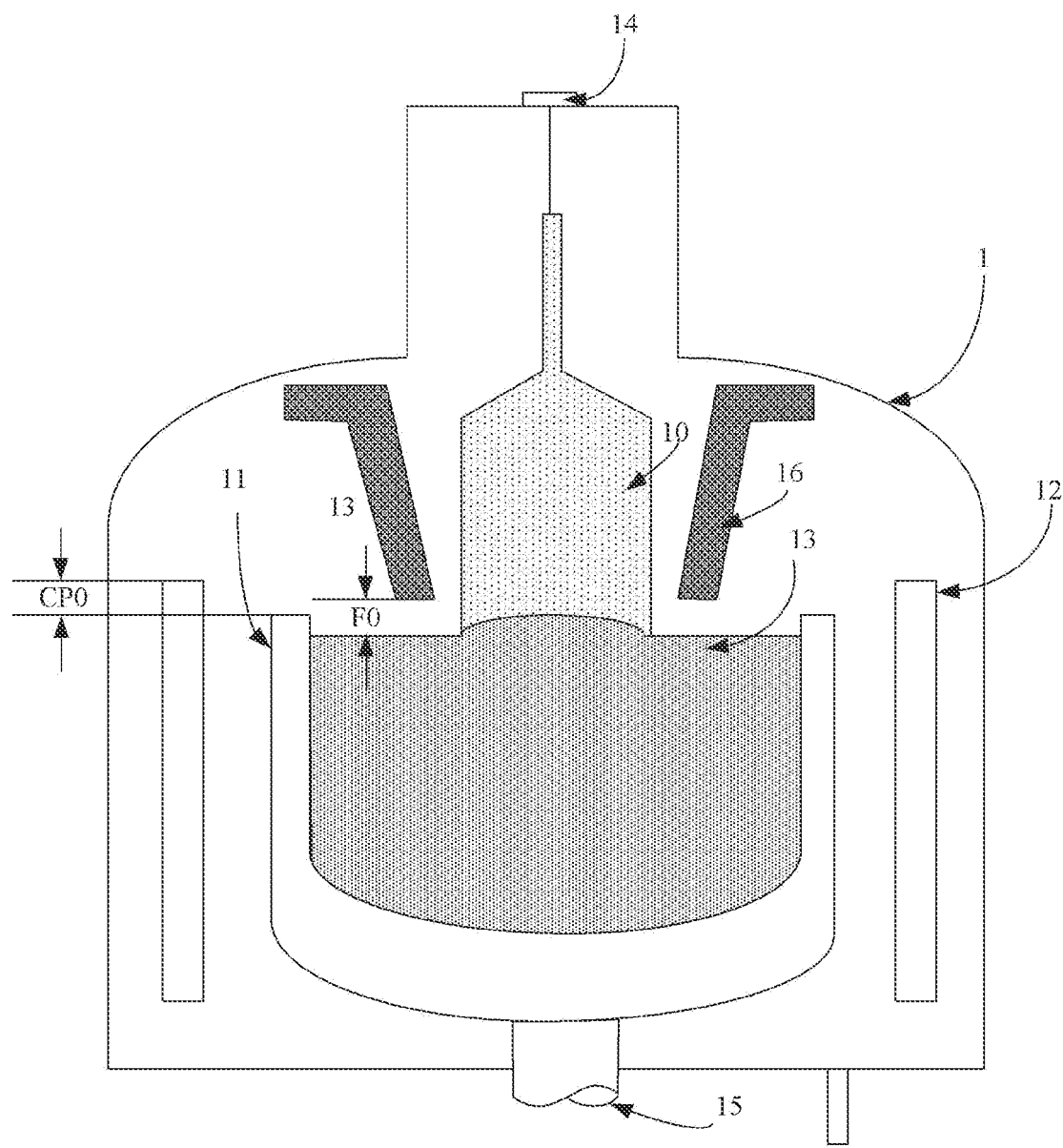
FIG. 1 is a structural schematic diagram of a semiconductor crystal growth device according to an embodiment of the present invention.

In the following description, numerous specific details are set forth in order to provide a more thorough understanding of the present invention. However, it is obvious to those skilled in this art that the present invention may be implemented without one or more of these details. Some technical features well-known in this art are not described in other examples in order to avoid confusion with the present invention.

In order to thoroughly understand the present invention, a detailed description will be provided in the following description to illustrate the semiconductor crystal growth method of the present invention. Obviously, the implementation of the present invention is not limited to the specific details familiar to those skilled in the semiconductor field. The preferred embodiments of the present invention are described in detail as follows. However, in addition to these detailed descriptions, the present invention may have other embodiments.

It shall be noted that the terminology used herein is for the purpose of describing particular embodiments only and is not intended to limit the exemplary embodiments of the present invention. As used herein, the singular forms are intended to include the plural forms as well, unless the context clearly indicates otherwise. It will be further understood that the terms "comprising" and/or "including," when used in this specification, specify the presence of stated features, wholes, steps, operations, elements, and/or components, but do not preclude the presence or addition of one or more other features, wholes, steps, operations, elements, components, and/or combinations thereof.

Now, exemplary embodiments according to the present invention will be described in more detail with reference to the accompanying drawings. However, these exemplary embodiments can be implemented in many different forms, and should not be construed as being limited to the embodiments set forth herein. It should be understood that these embodiments are provided to make the disclosure of the present invention thorough and complete, and to fully convey the concept of these exemplary embodiments to those of ordinary skill in the art. In the drawings, the thicknesses of layers and regions are exaggerated for clarity, and the same reference numerals are used to denote the same elements, whose descriptions will thus be omitted.

Referring to FIG. 1, there is shown a structural schematic diagram of a semiconductor crystal device. The semiconductor crystal growth device comprises a furnace body 1 in which a crucible 11 is provided. A heater 12 for heating the crucible 11 is provided outside the crucible 11. A silicon melt 13 is contained in the crucible 11. The crucible 11 is composed of a graphite crucible and a quartz crucible sleeved in the graphite crucible. The graphite crucible is heated by the heater to melt the polysilicon material in the quartz crucible to form a silicon melt, wherein each quartz crucible is used for one batch of semiconductor growth process, while each graphite crucible is used for multiple batches of semiconductor growth processes.

A pulling unit 14 is provided at a top portion of the furnace body 1. Under the driving of the pulling unit 14, the seed crystal pulls out the silicon ingot 10 from the silicon melt liquid surface. Meanwhile, a heat shield unit is disposed around the silicon ingot 10. Exemplarily, as shown in FIG. 1, the heat shield unit includes a flow tube 16, which is configured in a conical barrel shape. As a heat shield unit, on the one hand, it isolates the heat radiation generated by the quartz crucible and the silicon melt in the crucible to the crystal surface during the crystal growth process, boosts the cooling rate and axial temperature gradient of the ingot, and increases the number of crystal growth. On the other hand, it affects the thermal field distribution of the silicon melt surface and thereby avoids the axial temperature gradient between the center and edge of the ingot from differentiating too largely so as to ensure the stable growth between the ingot and the silicon melt liquid surface. Meanwhile, the flow tube is also used to guide the inert gas introduced from the upper part of the crystal growth furnace to cause it to pass through the silicon melt surface at a relatively large flow rate to achieve the effect of controlling oxygen content and impurity content in the crystal.

In order to realize stable growth of the silicon ingot, a driving device 15 for driving the crucible 11 to rotate and move up and down is also provided at the bottom of the furnace body 1. The driving device 15 drives the crucible 11 to keep rotating during the crystal pulling process to reduce the asymmetry of heat of the silicon melt and make the silicon ingot grow with equal diameter.

With the nucleation and growth of crystals during the semiconductor crystal growth, it is required to control the stable growth of silicon crystals by controlling process parameters including the position of liquid surface of the silicon melt and heater power. In the process of crystal growth, the graphite surface is consumed due to the cause that the heater and graphite crucible react with the gas $SiO_x$ in the furnace at high temperature, resulting in changes in electrical resistance and heat source morphology. Meanwhile, the same graphite crucible is applied to multiple batches of crystal growth processes, which causes the graphite crucible is consumed, thus the position of the crucible needs to be adjusted to ensure that the position of the silicon melt liquid surface remains stable when the same amount of silicon melt is contained in the graphite crucible.

In one example, in a quartz crucible in which it will grow a crystal with a diameter of 28 inches, with the progress of the crystal growth process and a charging amount of 300 kg of silicon melt in each batch, it is found that after 20 batches of the crystal growth processes, the initial position of the crucible at the beginning of the crystal pulling drops by 6 mm from that in the first crystal growth process. Meanwhile, the initial position of the crucible among 20 batches fluctuates within ±2.0 mm. Hence, it needs to modify the set power curve of the heater for each batch based on the initial position of the crucible. The change of heater power affects the diameter of the crystal after the crystal growth, the crystal pulling speed of the ingot, and even the internal defects and oxygen content of the ingot.

In order to solve the technical problems in the prior art, the present invention provides a semiconductor crystal growth method.

A semiconductor crystal growth method proposed by the present invention will be exemplarily described below with reference to FIG. 2, which is a flowchart of a semiconductor crystal growth method according to an embodiment of the present invention.

Figure 2:
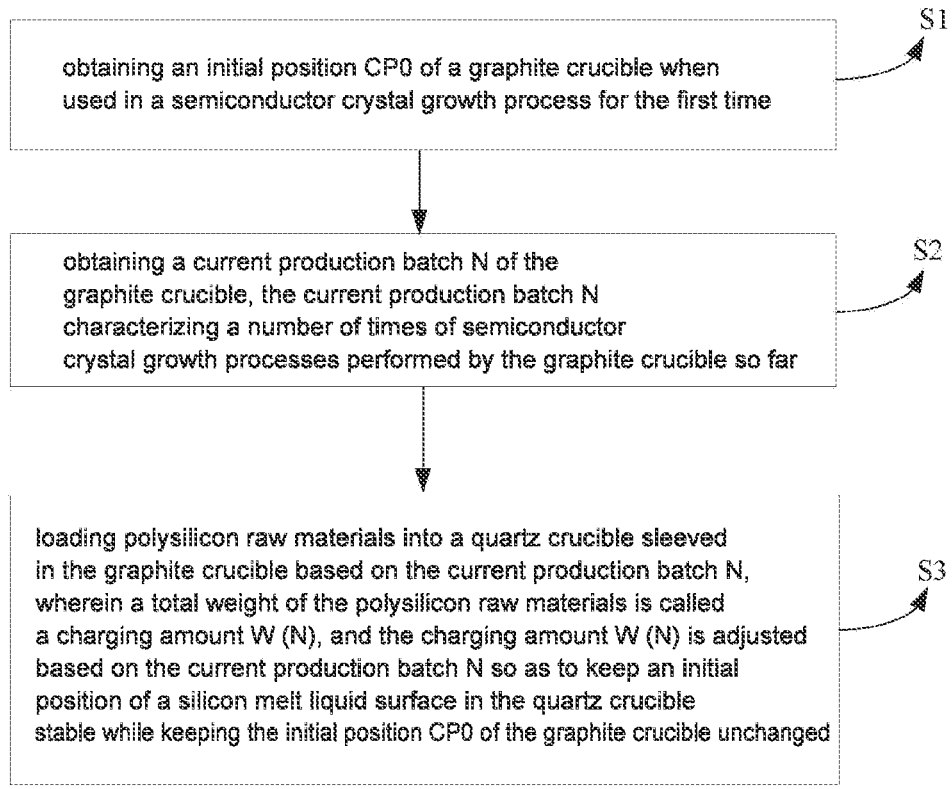
FIG. 2 is a flow chart of semiconductor crystal growth according to an embodiment of the present invention.

Referring first to FIG. 2, step S1 is performed: obtaining an initial position CP0 of a graphite crucible when used in a semiconductor crystal growth process for the first time.

During the production process, the crucible disposed in the furnace body is composed of a graphite crucible and a quartz crucible sleeved in the graphite crucible. The graphite crucible is heated by the heater to melt the polysilicon material in the quartz crucible to form a silicon melt, wherein each quartz crucible is used for one batch of semiconductor growth process, while each graphite crucible is used for multiple batches of semiconductor growth processes. The same graphite crucible is applied to multiple batches of crystal growth processes during which it often consumes graphite, resulting in a reduction of the wall thickness of the graphite crucible. In order to ensure that the silicon melt liquid surface in the quartz crucible remains stable in different growth batches while reducing the adjustment of process parameters (such as heater power) to decrease defects during crystal growth, as shown in FIG. 1 in the present invention, it obtains an initial position CP0 (i.e., the distance between the top portion of the crucible 11 and the top portion of the heater 12) of the graphite crucible when used in the semiconductor crystal growth process for the first time, and the weight of the polysilicon raw materials that are loaded into the quartz crucible when the crucible 11 is used in the semiconductor growth process for the first time, namely the charging amount W(1), wherein, in the case where the silicon melt 13 has a weight of W(1), the initial position FO (as shown in FIG. 1) of the liquid surface of the silicon melt 13 is the distance between the liquid surface of the silicon melt 13 and the bottom of the flow tube 16. In the present invention, by fixing CP0 during the subsequent batches of semiconductor crystals growth, and changing the charging amount W(i) in the quartz crucible (where i=1, 2, 3 . . . , indicating the current batch of semiconductor crystal growth process), the method controls the stability of the initial position FO of the silicon melt liquid surface, such that there is no need to adjust the heating power of the heater, which effectively reduces the change in process parameters during the crystal growth process and improves the crystal growth speed and quality.

In this embodiment, the weight W of the silicon melt 13 determined hereby is used to further determine the charging amount in the current production batch N, which will be further introduced in subsequent steps.

In an example according to the present invention, the initial position CP0 of the graphite crucible when used in the semiconductor crystal growth process for the first time can be obtained by the initial setting of the crystal growth device, and the quality of the silicon melt contained therein is also obtained by the initial setting.

Next, continuing with reference to FIG. 2, step S2 is performed: obtaining a current production batch N of the graphite crucible, the current production batch N characterizing a number of times of semiconductor crystal growth processes performed by the graphite crucible so far.

During the crystal growth process, the same graphite crucible is often applied to multiple batches of crystal growth processes to obtain multiple silicon ingots. The current production batch of the graphite crucible is obtained, that is, how many times of semiconductor crystal growth processes have been carried out in total from the first application of the graphite crucible to the crystal growth process to the current batch. During the growth of these semiconductor crystals, the initial position of the silicon melt liquid surface in the quartz crucible always remains stable.

Continuing with reference to FIG. 2, step S3 is performed: loading polysilicon raw materials into a quartz crucible sleeved in the graphite crucible based on the current production batch N, wherein a total weight of the polysilicon raw materials is called a charging amount W (N), and the charging amount W (N) is adjusted based on the current production batch N so as to keep an initial position of a silicon melt liquid surface in the quartz crucible stable while keeping the initial position CP0 of the graphite crucible unchanged.

In this step, by adjusting the charging amount, the position CP0 of the graphite crucible remains unchanged while keeping the initial liquid surface position of the silicon melt in the quartz crucible stable, such that there is no need to adjust the heating power of the heater, which effectively reduces the change in process parameters during the crystal growth process and improves the crystal growth speed and quality.

Exemplarily, in this embodiment, by obtaining from S1 a charging amount W(1) in the quartz crucible when the graphite crucible is used in the semiconductor growth process for the first time and a charging amount dW that should be increased in the quartz crucible when the graphite crucible is used in the current production batch N, the charging amount W(N) is a sum of the charging amount W(1) in the quartz crucible when the graphite crucible is used in the semiconductor growth process for the first time and the charging amount dW that should be increased in the quartz crucible when the graphite crucible is used in the current production batch N.

Exemplarily, the method for obtaining the charging amount dW that should be increased in the quartz crucible when the graphite crucible is used in the current production batch N comprises:

Step S31: obtaining a calculated initial position CP0(N)' of the graphite crucible in the current production batch N to ensure that the initial position of the silicon melt liquid surface remains unchanged in the case that the charging amount in the quartz crucible remains unchanged.

Exemplarily, the calculated initial position CP0(N)' is obtained by the following equation:

CP0(N)'=A*N+B, where A is a batch impact factor of the crucible and B is a wall thickness related parameter of the crucible.

According to an example of the present invention, the batch impact factor A and the wall thickness related parameter B are obtained by using the same graphite crucible to perform multiple batches of semiconductor crystal growth processes in which the charging amount in the quartz crucible remains unchanged and the initial position of the graphite crucible is adjusted to obtain the initial position of the same silicon melt liquid surface. It should be understood that although the semiconductor crystal growth process of the traditional process, in which the charging amount in the quartz crucible remains unchanged and the initial position of the graphite crucible is adjusted to obtain the same initial liquid surface position, is different from that of the present application, in which the initial position of the graphite crucible remains unchanged and the charging amount in the quartz crucible is adjusted to obtain the same initial liquid surface position, the reduction of the wall thickness of the graphite crucible is equivalent with the increase of production batches in the two growth processes of semiconductor crystals. That is to say, the batch impact factor A in each batch of semiconductor growth process and the wall thickness related parameter B of the graphite crucible in the process can be regarded as the same, and they do not change with the change in the initial position of the graphite crucible.

Specifically, the batch impact factor A and the wall thickness related parameter B are obtained by the steps of:

Step S311 is first performed: obtaining a large number of batch M semiconductor crystal growth processes performed by using the same graphite crucible, in the large number of batch M semiconductor production processes, the quartz crucible has the same charging amount, and the initial position of the same silicon melt liquid surface is obtained by adjusting the initial position of the graphite crucible.

This procedure can be obtained directly from the production line of the traditional production process. Exemplarily, the same graphite crucible can perform 100 times of semiconductor crystal growth processes, and the large number of batches M that can be obtained is 100. In these 100 times of the semiconductor crystal growth processes, quartz crucible has the same charging amount in each batch, and the same initial position of the silicon melt liquid surface in quartz crucible in each batch is obtained by adjusting the initial position of the graphite crucible.

Step S312 is then performed: obtaining an adjusted initial position CP0(i) of the graphite crucible in each batch in the large number of batch M semiconductor crystal production processes, where i=1, 2 . . . M.

This procedure can be obtained directly from the production line of the traditional production process. Exemplarily, the initial position CP0(i) of the graphite crucible in each batch is obtained in the 100 batches of semiconductor crystal growth processes, where i=1, 2 . . . 100. In the semiconductor growth process, as the batches increase, the wall thickness of the graphite crucible gradually decreases, and the initial position CP0(i) of the graphite crucible gradually increased. In one example, the adjusted initial position of the graphite crucible is −30 mm when used in the semiconductor crystal growth process for the first time, and the adjusted initial position of the graphite crucible is −26 mm in the $20^{th}$ batch.

Next, Step S313 is performed: obtaining a correlation between the adjusted initial position CP0 (i) of the graphite crucible and batch i based on the adjusted initial position CP0 (i) of the graphite crucible.

Figure 3:
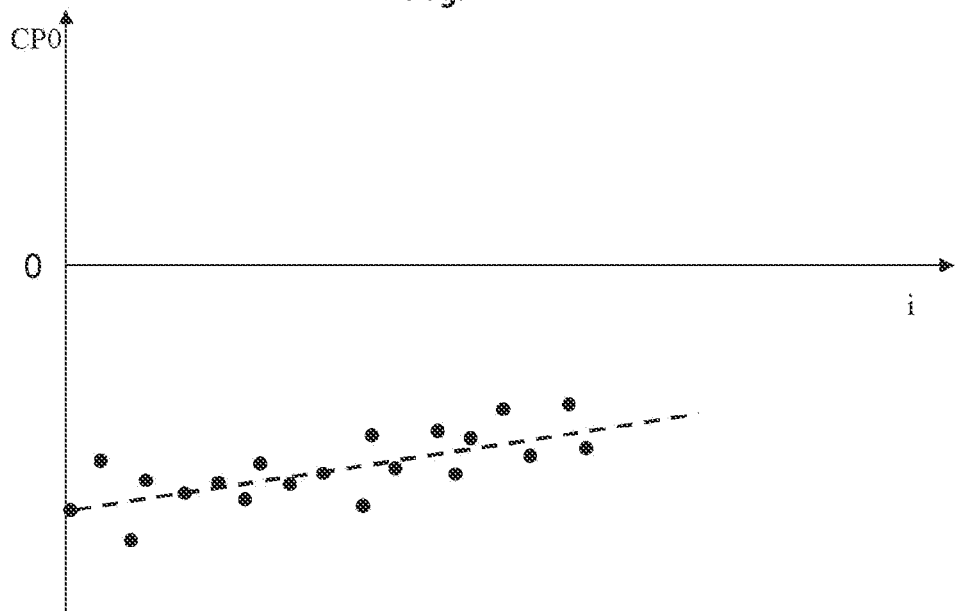
FIG. 3 is a schematic diagram of a correlation curve between the adjusted initial position of the crucible and the batch according to an embodiment of the present invention.

Exemplarily, this step is obtained by plotting the correlation curve between the adjusted initial position CP0(i) of the graphite crucible and batch i. Referring to FIG. 3, there is shown a schematic diagram of the correlation curve between the adjusted initial position of the graphite crucible and the batch according to an embodiment of the present invention.

In the plotted correlation curve, a scattered point-like distribution diagram is often obtained. It can be derived that a linear relationship is presented between the adjusted initial position CP0(i) of the graphite crucible and batch i by graph line fitting, where CP0(i)=A*i+B.

Step S314 is then performed: obtaining the batch impact factor A and the wall thickness related parameter B based on the correlation.

Continuing with reference to FIG. 3, in the linear relationship, obtained by fitting, between the adjusted initial position CP0(i) of the crucible and batch i, the slope characterizes a batch impact factor A, and a place where the diagonal line of the linear relationship extends to intersect with the CP0 axis characterizes a wall thickness related parameter B.

The calculated initial position CP0(N)'=A*N+B is calculated based on the batch impact factor A and the wall thickness related parameters B obtained by the above method. In order to obtain the charging amount dW that should be increased in the quartz crucible in the current production batch N, continue to perform step S32: obtaining an initial position difference dCP0(N) based on the calculated initial position CP0(N)' and the initial position CP0 of the graphite crucible when used in the semiconductor growth process for the first time, wherein dCP0(N)= CP0(N)'- CP0.

Next, step S33 is performed: obtaining a charging amount dW that should be increased in the quartz crucible in the current production batch N based on the initial position difference dCP0(N).

According to an embodiment of the present invention, the charging amount dW that should be increased in the current production batch N is obtained by the following equation:

$$dW = \pi\left(\frac{D}{2}\right)^2 * dCP0(N) * Rho,$$

where D is a diameter of the quartz crucible, and Rho is a density of the silicon melt.

It should be understood that the above method of calculating the charging amount that should be increased currently is only exemplary, and those skilled in the art can also obtain the charging amount that should be increased in the quartz crucible directly by the initial position difference dCP0(N) based on, for example, the proportional relationship between the weight of the silicon melt in the quartz crucible and the crucible depth. The method of obtaining the calculated initial position CP0(N)' in the above embodiment is also exemplary only. In the case of using relevant data in a large number of batches of semiconductor crystal growth, for example, the calculated initial position CP0(N)' of the graphite crucible in the current production batch N can also be calculated by methods such as machine learning.

In the actual production process, the configuration of the quartz crucible sleeved in the graphite crucible is often used to dispose the semiconductor growth device, wherein each quartz crucible is used for one batch of semiconductor growth process, while each graphite crucible is used for multiple batches of semiconductor growth process. In every replacement of the quartz crucible, it has a certain diameter deviation ΔD. Therefore, in the above equation for calculating the charging amount, it needs to be determined based on the diameter D of the quartz crucible to be replaced each time.

According to an embodiment of the present invention, after the quartz crucible is charged based on the current production batch N in the above step S3, the semiconductor crystal growth process is started, including the steps of growing the semiconductor crystals well known to those skilled in the art, such as Vacuuming, Silicon Melting, Neck, Shoulder, Body, Tail, Cooling, etc., which is not detailed here. At the same time, the change of heater power needs to be controlled in these steps.

Figure 4A:
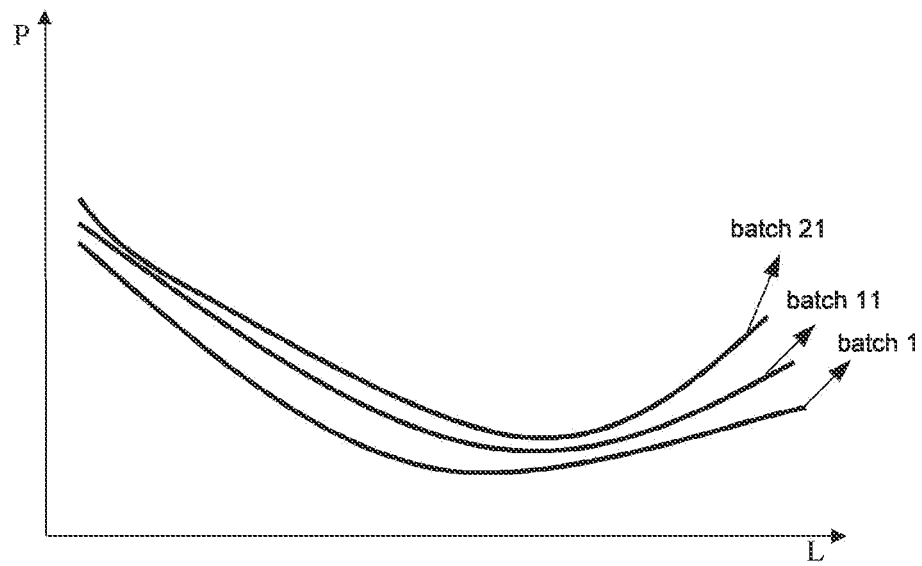
FIG. 4A is a curve of change of heater power P with the equal diameter length L during the semiconductor growth process.
Figure 4B:
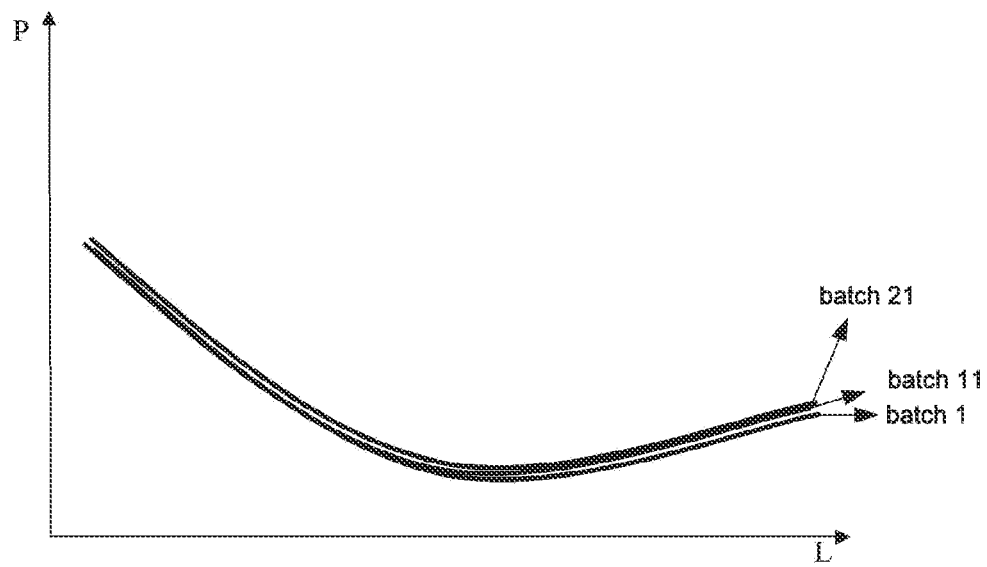
FIG. 4B is a curve of change of heater power P with the equal diameter length L during the semiconductor growth process according to an embodiment of the present invention.

Referring to FIGS. 4A and 4B, there are shown a curve of change of heater power P with the equal diameter length L during the semiconductor growth process and a curve of change of heater power P with the equal diameter length L during the semiconductor growth process according to an embodiment of the present invention, respectively. It can be seen from FIG. 4A that when the growth batches are 1, 11 and 21, the curve of change of heater power P with the equal diameter length L needs to be adjusted with different production batches. According to the embodiment of the present invention, as shown in FIG. 4B, the curve of change of heater power P with the equal diameter length L basically does not need to be adjusted when the growth batches are 1, 11, and 21. Obviously, the semiconductor crystal growth method according to the present invention effectively reduces the number of process parameters that need to be adjusted during the semiconductor crystal growth process (especially the heater power setting can be kept unchanged), such that the crystal diameter, crystal pulling speed and the quality of the crystal can be reproducible, which effectively improves the speed and quality of semiconductor crystal growth.

Embodiment 2

The present invention further provides a semiconductor crystal growth device comprising a memory storing executable program instructions and a controller, wherein when performing the executable program instructions, the controller causes the semiconductor growth device to execute the steps of:

obtaining an initial position CP0 of a graphite crucible when used in a semiconductor crystal growth process for the first time;

obtaining a current production batch N of the graphite crucible, the current production batch N characterizing a number of times of semiconductor crystal growth processes performed by the graphite crucible so far;

loading polysilicon raw materials into a quartz crucible sleeved in the graphite crucible based on the current production batch N, wherein a total weight of the polysilicon raw materials is called a charging amount W (N), and the charging amount W (N) is adjusted based on the current production batch N so as to keep an initial position of liquid surface of a silicon melt in the quartz crucible stable while keeping the initial position CP0 of the graphite crucible unchanged.

In the semiconductor crystal growth device according to the present invention, the initial position of the graphite crucible is configured to be unchanged during the crystal pulling process, and the charging amount in the quartz crucible is changed to ensure the stability of the initial position of liquid surface of the silicon melt in the quartz crucible, which effectively reduces the adjustment of process parameters in the crystal pulling process, ensures the stability of various parameters in the crystal pulling process, and improves the crystal pulling speed and quality. Meanwhile, the above steps of configuring the charging amount are realized by the memory storing executable program instructions and the controller such that the charging amount can be programmed, which reduces manual operation steps, simplifies operations, and improves work efficiency.

The present invention has been described by the above embodiments, but it is to be understood that the embodiments are for the purpose of illustration and explanation only, and are not intended to limit the present invention within the scope of the embodiments described herein. Furthermore, those skilled in the art can understand that the present invention is not limited to the above embodiments. Various variations and modifications can be made according to the teachings of the present invention. These variations and modifications may fall within the protection scope of the present invention as defined in the appended claims and their equivalents.

What is claimed is:

1. A method for ensuring stability of parameters in a crystal pulling process, comprising:
    obtaining an initial position CP0 of a graphite crucible when used in a semiconductor crystal growth process for a first time;
    obtaining a current production batch N of the graphite crucible, the current production batch N characterizing that the graphite crucible currently performs a semiconductor crystal growth process for a Nth;
    determining a total weight W(N) of polysilicon raw materials to be loaded into a quartz crucible sleeved in the graphite crucible based on the current production batch N, wherein the total weight W(N) of polysilicon raw materials enables to keep an initial position of liquid surface of a silicon melt in the quartz crucible stable while keeping the initial position CP0 of the graphite crucible unchanged, and wherein the determining a total weight W(N) of polysilicon raw materials to be loaded into a quartz crucible sleeved in the graphite crucible further comprises:
        obtaining a charging amount W(1) of polysilicon raw materials loaded in the quartz crucible for the first time of the semiconductor growth process,
        determining an increase of charging amount dW to be increased in the quartz crucible for the Nth time of the semiconductor growth process, and
        computing a sum of the charging amount W(1) and the increase of charging amount dW to obtain the total weight W(N); and
    loading the total weight W(N) of polysilicon raw materials into the quartz crucible sleeved in the graphite crucible to keep the initial position of liquid surface of the silicon melt in the quartz crucible stable while keeping the initial position CP0 of the graphite crucible unchanged.

2. The method according to claim 1, wherein the method for obtaining the charging amount dW in the crucible that should be increased in the current production batch N comprises:
    Obtaining a calculated initial position CP0(N)' of the graphite crucible in the current production batch N to ensure that the initial position of liquid surface of the silicon melt remains unchanged in the case that the charging amount in the quartz crucible remains unchanged;
    obtaining an initial position difference dCP0(N) based on the calculated initial position CP0(N)' and the initial position CP0 of the graphite crucible when used in the semiconductor growth process for the first time, wherein dCP0(N)=CP0(N)'−CP0; and
    obtaining a charging amount dW that should be increased in the quartz crucible in the current production batch N based on the initial position difference dCP0(N).

3. The method according to claim 1, wherein the calculated initial position CP0(N)' is obtained by the following equation:
    CP0(N)'=A*N+B, where A is a batch impact factor of the crucible and B is a wall thickness related parameter of the crucible.

4. The method according to claim 3, wherein the batch impact factor A and the wall thickness related parameter B are obtained by the steps of:
    obtaining a large number of batches M of semiconductor crystal growth processes performed using a same graphite crucible, wherein the quartz crucible sleeved in the graphite crucible has the same charging amount in the large number of batches M of semiconductor crystal growth processes, and same initial position of liquid surface of the silicon melt is obtained by adjusting the initial position of the graphite crucible;
    obtaining an adjusted initial position CP0 (i) of the graphite crucible in each batch of the large number of batches M of semiconductor crystal growth processes, where i=1, 2 . . . M;
    obtaining a correlation between the adjusted initial position CP0 (i) of the crucible and a batch i based on the adjusted initial position CP0 (i) of the graphite crucible; and
    obtaining the batch impact factor A and the wall thickness related parameter B based on the correlation.

5. The method according to claim 4, wherein the step of obtaining the correlation between the adjusted initial position CP0 (i) of the graphite crucible and the batch i based on the adjusted initial position CP0 (i) of the graphite crucible comprises obtaining a correlation curve between the adjusted initial position CP0 (i) of the graphite crucible and the batch i.

6. The method according to claim 2, wherein the charging amount dW that should be increased in the quartz crucible in the current production batch N is obtained by the following equation:

$$dW = \pi\left(\frac{D}{2}\right)^2 * dCP0(N) * Rho,$$

where D is a diameter of the quartz crucible, and Rho is a density of the silicon melt.

7. A device for ensuring stability of parameters in a crystal pulling process, wherein the device comprises a memory storing executable program instructions and a controller, wherein the executable program instructions upon execution by the controller cause the device to perform operations comprising:
    obtaining an initial position CP0 of a graphite crucible used in a semiconductor crystal growth process for a first time;
    obtaining a current production batch N of the graphite crucible, the current production batch N characterizing that the graphite crucible currently performs a semiconductor crystal growth process for a Nth time;
    determining a total weight W(N) of polysilicon raw materials to be loaded into a quartz crucible sleeved in the graphite crucible based on the current production batch N, wherein the total weight W(N) of polysilicon raw materials enables to keep an initial position of liquid surface of a silicon melt in the quartz crucible stable while keeping the initial position CP0 of the graphite crucible unchanged, and wherein the determining a total weight W(N) of polysilicon raw materials to be loaded into a quartz crucible sleeved in the graphite crucible further comprises:
  obtaining a charging amount W(1) of polysilicon raw materials loaded in the quartz crucible for the first time of the semiconductor growth process,
  determining an increase of charging amount dW to be increased in the quartz crucible for the Nth time of the semiconductor growth process, and
  computing a sum of the charging amount W(1) and the increase of charging amount dW to obtain the total weight W(N); and
loading the total weight W(N) of polysilicon raw materials into the quartz crucible sleeved in the graphite crucible to keep the initial position of liquid surface of the silicon melt in the quartz crucible stable while keeping the initial position CP0 of the graphite crucible unchanged.

\* \* \* \* \*